(12) United States Patent
Kadoguchi et al.

(10) Patent No.: US 11,545,419 B2
(45) Date of Patent: Jan. 3, 2023

(54) SEMICONDUCTOR PACKAGE HAVING AN ADDITIONAL MATERIAL WITH A COMPARATIVE TRACKING INDEX (CTI) HIGHER THAN THAT OF ENCAPSULANT RESIN MATERIAL FORMED BETWEEN TWO TERMINALS

(71) Applicants: TOYOTA JIDOSHA KABUSHIKI KAISHA, Toyota (JP); DENSO CORPORATION, Kariya (JP)

(72) Inventors: Takuya Kadoguchi, Toyota (JP); Takahiro Hirano, Toyota (JP); Arata Harada, Gamagori (JP); Tomomi Okumura, Chiryu (JP); Keita Fukutani, Anjo (JP); Masayoshi Nishihata, Nagoya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 16/239,796

(22) Filed: Jan. 4, 2019

(65) Prior Publication Data

US 2019/0139874 A1 May 9, 2019

Related U.S. Application Data

(62) Division of application No. 15/103,594, filed as application No. PCT/IB2014/002704 on Dec. 9, 2014, now abandoned.

(30) Foreign Application Priority Data

Dec. 11, 2013 (JP) .............................. JP2013-256494

(51) Int. Cl.
*H01L 23/495* (2006.01)
*H01L 23/00* (2006.01)
(Continued)

(52) U.S. Cl.
CPC .... *H01L 23/49562* (2013.01); *H01L 23/3107* (2013.01); *H01L 23/3114* (2013.01);
(Continued)

(58) Field of Classification Search
CPC ........... H01L 23/3114; H01L 23/49513; H01L 23/49568
See application file for complete search history.

(56) References Cited

U.S. PATENT DOCUMENTS

| 2008/0224643 A1 | 9/2008 | Sakurai et al. |
| 2009/0213553 A1 | 8/2009 | Tschirbs et al. |

(Continued)

FOREIGN PATENT DOCUMENTS

| DE | 102009000588 A1 | 10/2009 |
| JP | 2008-228547 A | 9/2008 |

(Continued)

OTHER PUBLICATIONS

Nishimura, Takashi et al., "High Performance Transfer-molded Power Module," pp. 219-223.

(Continued)

*Primary Examiner* — Anh D Mai
(74) *Attorney, Agent, or Firm* — Oliff PLC

(57) ABSTRACT

A semiconductor device includes a first switching element; a second switching element; a first metal member; a second metal member; a first terminal that has a potential on a high potential side; a second terminal that has a potential on a low potential side; a third terminal that has a midpoint potential; and a resin part. A first potential part has potential equal to potential of the first terminal. A second potential part has potential equal to potential of the second terminal. A third potential part has potential equal to potential of the third terminal. A first creepage distance between the first potential part and the second potential part is longer than a minimum value of a second creepage distance between the first potential part and the third potential part and a third creepage (Continued)

distance between the second potential part and the third potential part.

5 Claims, 12 Drawing Sheets

(51) Int. Cl.
*H01L 23/31* (2006.01)
*H01L 23/433* (2006.01)
*H01L 29/739* (2006.01)
*H01L 29/861* (2006.01)
*H02M 7/00* (2006.01)
*H01L 23/051* (2006.01)

(52) U.S. Cl.
CPC .... *H01L 23/4334* (2013.01); *H01L 23/49513* (2013.01); *H01L 23/49568* (2013.01); *H01L 23/49575* (2013.01); *H01L 24/33* (2013.01); *H01L 29/7395* (2013.01); *H01L 29/861* (2013.01); *H02M 7/003* (2013.01); *H01L 23/051* (2013.01); *H01L 2924/13055* (2013.01); *H01L 2924/13091* (2013.01); *H01L 2924/181* (2013.01)

(56) References Cited

U.S. PATENT DOCUMENTS

| 2013/0003305 A1 | 1/2013 | Stella |
| 2014/0021638 A1* | 1/2014 | Mahler ............... H01L 23/5389 257/777 |
| 2014/0035112 A1 | 2/2014 | Kadoguchi et al. |

FOREIGN PATENT DOCUMENTS

| JP | 2012-015453 A | 1/2012 |
| JP | 2012-235081 A | 11/2012 |
| JP | 2013-149684 A | 8/2013 |
| JP | 2015-057807 A | 3/2015 |

OTHER PUBLICATIONS

Tada, Kazuhiro et al., "Molding Technology for Power Modules," pp. 743-746.
Jul. 17, 2017 Office Action Issued in U.S. Appl. No. 15/103,594.
Jan. 10, 2018 Office Action Issued in U.S. Appl. No. 15/103,594.
Sep. 6, 2018 Office Action issued in U.S. Appl. No. 15/103,594.

* cited by examiner

SEMICONDUCTOR PACKAGE HAVING AN ADDITIONAL MATERIAL WITH A COMPARATIVE TRACKING INDEX (CTI) HIGHER THAN THAT OF ENCAPSULANT RESIN MATERIAL FORMED BETWEEN TWO TERMINALS

CROSS REFERENCE TO RELATED APPLICATION

This application is a division of U.S. application Ser. No. 15/103,594, filed Jun. 10, 2016, the contents of which are incorporation herein by reference.

BACKGROUND OF THE INVENTION

1. Field of the Invention

The present invention relates to a semiconductor device.

2. Description of Related Art

There has been known a semiconductor device that includes first to fourth thick plate parts and first and second thin plate parts, in which the first thin plate part and the second thin plate part are fastened and connected electrically with each other (for example, see Japanese Patent Application Publication No. 2012-235081 (JP 2012-235081 A)). In JP 2012-235081 A, the first thick plate part is connected electrically with an electrode on a lower surface side of a first semiconductor element. Further, the second thick plate part is connected with an electrode on a lower surface side of a second semiconductor element disposed in parallel with the first semiconductor element. Further, the third thick plate part is connected with an electrode on an upper surface side of the first semiconductor element. Further, the fourth thick plate part is connected with an electrode on an upper surface side of the second semiconductor element. Further, the first thin plate part is disposed on the second thick plate part. Then, the second thin plate part is disposed on the third thick plate part.

Now, in this kind of the semiconductor device, the semiconductor elements and the like are sealed with a resin. Terminals exposed from a resin part include a first terminal that has a potential on a high potential side of upper and lower arms, a second terminal that has a potential on a low potential side of the upper and lower arms, and a third terminal that has a mid-point potential of the upper and lower arms. In such a configuration, it is useful to prevent short-circuiting from occurring between a site that has a potential of a high potential side (first terminal, for example) and a site that has a potential of a low potential side (second terminal, for example).

SUMMARY OF THE INVENTION

The present invention intends to provide a semiconductor device that can reduce likelihood of short-circuiting between a site that has a potential of a high potential side and a site that has a potential of a low potential side.

A semiconductor device according to a first aspect of the present invention includes: a first switching element that includes a first electrode and a second electrode and constitutes an upper arm of upper and lower arms, the first electrode and the second electrode of the first switching element respectively constituting both sides of the first switching element in a first direction; a second switching element that is aligned with the first switching element in a second direction, includes a first electrode and a second electrode, and constitutes the lower arm of the upper and lower arms, the first electrode and the second electrode of the second switching element respectively constituting both sides of the second switching element in the first direction; a first metal member that is electrically connected with the first electrode of the first switching element in the first direction; a second metal member that is electrically connected with the first electrode of the second switching element in the first direction; a first terminal that has a potential on a high potential side of the upper and lower arms; a second terminal that has a potential on a low potential side of the upper and lower arms; a third terminal that has a midpoint potential of the upper and lower arms; and a resin part that integrally covers the first switching element, the second switching element, at least a part of the first metal member, at least a part of the second metal member, a part of the first terminal, a part of the second terminal, and a part of the third terminal. When a part that has potential equal to potential of the first terminal is assumed as a first potential part, a part that has potential equal to potential of the second terminal is assumed as a second potential part, and a part that has potential equal to potential of the third terminal is assumed as a third potential part, a first creepage distance between the first potential part and the second potential part along a surface of the resin part is longer than a minimum value of a second creepage distance between the first potential part and the third potential part along the surface of the resin part and a third creepage distance between the second potential part and the third potential part along the surface of the resin part. The first direction is orthogonal with respect to the second direction.

A semiconductor device according to a second aspect of the present invention includes: a first switching element that includes a first electrode and a second electrode and constitutes an upper arm of upper and lower arms, the first electrode and the second electrode of the first switching element respectively constituting both sides of the first switching element in a first direction; a second switching element that is aligned with the first switching element in a second direction, includes a first electrode and a second electrode, and constitutes the lower arm of the upper and lower arms, the first electrode and the second electrode of the second switching element respectively constituting both sides of the second switching element in the first direction; a first metal member that is electrically connected with the first electrode of the first switching element in the first direction; a second metal member that is electrically connected with the first electrode of the second switching element in the first direction; a first terminal that has a potential on a high potential side of the upper and lower arms; a second terminal that has a potential on a low potential side of the upper and lower arms; a third terminal that has a midpoint potential of the upper and lower arms; and a resin part that integrally covers the first switching element, the second switching element, at least a part of the first metal member, at least a part of the second metal member, a part of the first terminal, a part of the second terminal, and a part of the third terminal. When a part that has potential equal to potential of the first terminal is assumed as a first potential part, a part that has potential equal to potential of the second terminal is assumed as a second potential part, and a part that has potential equal to potential of the third terminal is assumed as a third potential part, a comparative tracking index of a first material that is provided between the first potential part and the second potential part in the resin part is higher than at least one of comparative tracking indexes of a second material and a third material, the second material being provided between the first potential part and the third potential part in the resin part, and the third material being provided between the second potential part and the third potential part in the resin part. When a minimum value of creepage distances between the first potential part and the second potential part in the resin part is set to $L_1$, a minimum creepage distance that is permitted to the first material between the first potential part and the second potential part is set to $L_1$ min, a minimum value of the creepage distances between the first potential part and the third potential part in the resin part is set to $L_2$, the minimum creepage distance that is permitted to the second material between the first potential part and the third potential part is set to $L_2$ min, the minimum value of the creepage distance between the second potential part and the third potential part along the surface of the resin part is set to $L_3$, and the minimum creepage distance that is permitted to the third material between the second potential part and the third potential part is set to $L_3$ min, at least any one of the following two formulas is satisfied.

$$(L_2-L_2\text{ min})/L_2\text{ min} < (L_1-L_1\text{ min})/L_1\text{ min}$$

$$(L_3-L_3\text{ min})/L_3\text{ min} < (L_1-L_1\text{ min})/L_1\text{ min}$$

The first direction is orthogonal with respect to the second direction.

A semiconductor device according to a third aspect of the present invention includes: a first switching element that includes a first electrode and a second electrode and constitutes an upper arm of upper and lower arms, the first electrode and the second electrode of the first switching element respectively constituting both sides of the first switching element in a first direction; a second switching element that is aligned with the first switching element in a second direction, includes a first electrode and a second electrode, and constitutes the lower arm of the upper and lower arms, the first electrode and the second electrode of the second switching element respectively constituting both sides of the second switching element in the first direction; a first metal member that is electrically connected with the first electrode of the first switching element in the first direction; a second metal member that is electrically connected with the first electrode of the second switching element in the first direction; a first terminal that has a potential on a high potential side of the upper and lower arms; a second terminal that has a potential on a low potential side of the upper and lower arms; a third terminal that has a midpoint potential of the upper and lower arms; and a resin part that integrally covers the first switching element, the second switching element, at least a part of the first metal member, at least a part of the second metal member, a part of the first terminal, a part of the second terminal, and a part of the third terminal. When a part that has potential equal to potential of the first terminal is assumed as a first potential part, a part that has potential equal to potential of the second terminal is assumed as a second potential part, and a part that has potential equal to potential of the third terminal is assumed as a third potential part, a first spatial distance between the first potential part and the second potential part is longer than a minimum value of a second spatial distance between the first potential part and the third potential part and a third spatial distance between the second potential part and the third potential part. The first direction is orthogonal with respect to the second direction.

According to the first, second and third aspects of the present invention, a semiconductor device that can reduce the likelihood of short-circuiting between a site that has a potential of a high potential side and a site that has a potential of a low potential side can be obtained.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

Each of FIG. 6A, FIG. 6B

Each of FIG. 7A

Each of FIG. 8A

Each of FIG. 12A, FIG. 12B

Each of FIG. 13A

Each of FIG. 14A

DETAILED DESCRIPTION OF EMBODIMENTS

Hereinafter, with reference to accompanying drawings, each of embodiments will be described in detail.

Figure 1:
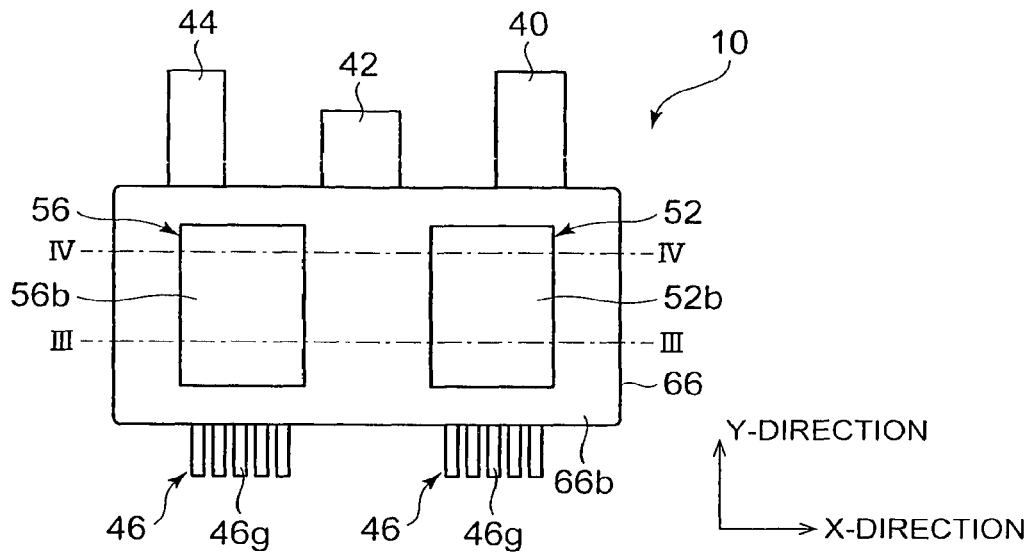
FIG. 1 is a top view that shows a semiconductor device according to an embodiment (first embodiment)
Figure 2:
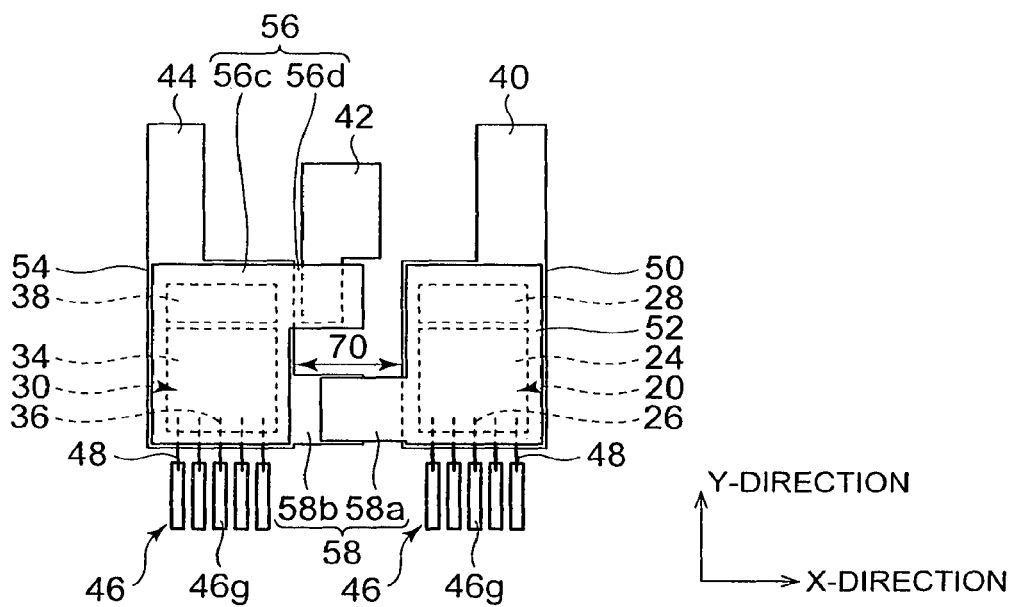
FIG. 2 is a diagram obtained by omitting a resin part in the semiconductor device of FIG. 1.
Figure 3:
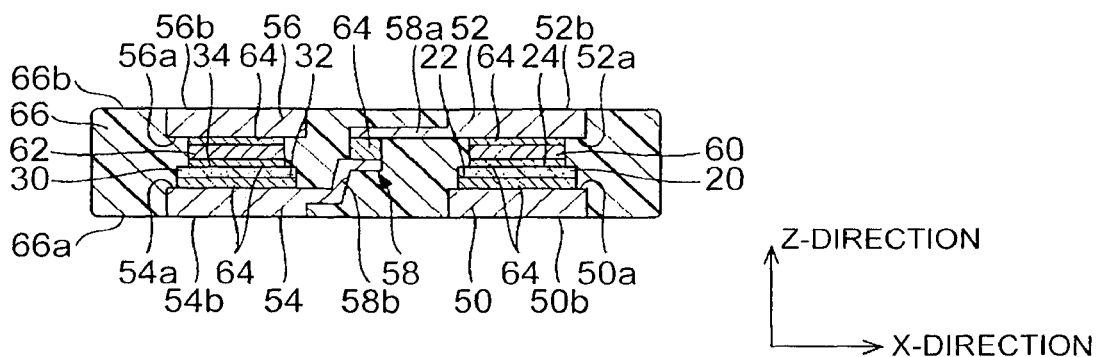
FIG. 3 is a cross-sectional view along a III-III line of FIG. 1.
Figure 4:
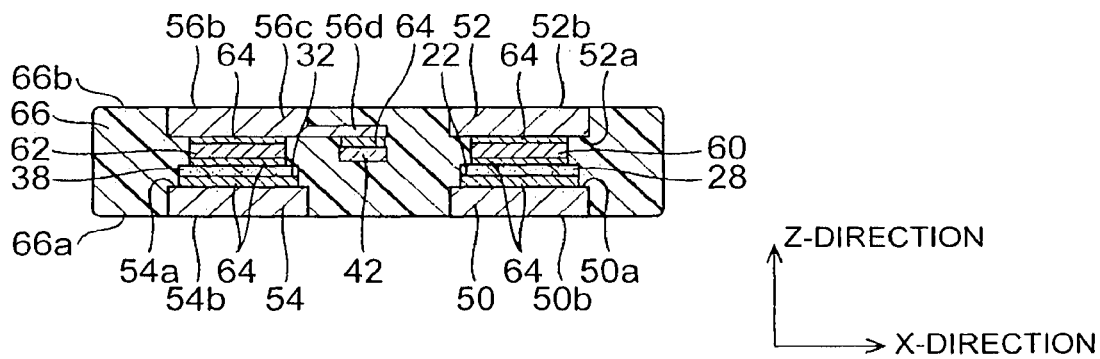
FIG. 4 is a cross-sectional view along a IV-IV line of FIG. 1.

FIG. 1 is a top view that shows a semiconductor device 10 according to an embodiment (first embodiment). FIG. 2 is a diagram obtained by omitting a resin part in the semiconductor device of FIG. 1. FIG. 3 is a cross-sectional view along a III-III line of FIG. 1. FIG. 4 is a cross-sectional view along a IV-IV line of FIG. 1.

The semiconductor device 10 is used typically in a power conversion device such as an inverter and a converter for driving a running motor in a hybrid vehicle and an electric vehicle. However, the semiconductor device 10 may be used in other applications in a vehicle (for an electric steering device, for example), or may be used in applications for other than the vehicle (for example, a power supply unit or the like for other electric device).

In the following description, for convenience sake, a thickness direction of an Insulated Gate Bipolar Transistor (IGBT) element is taken as a Z direction. Further, a direction that is orthogonal to the Z direction and in which two IGBT elements that constitute upper and lower arms are arranged is taken as an X direction. Further, a direction that is orthogonal to both the X direction and the Z direction is taken as a Y direction. In the following description, although, for convenience sake, the Z direction corresponds to a vertical direction and a side in which a first terminal 60 is present with respect to a first heat sink 50 is taken as an "upper side", and a mounting direction of the semiconductor device 10 is optional.

The semiconductor device 10 includes IGBT elements 20 and 30, free wheel diodes (FWDs) 28 and 38, a high potential power terminal 40, a low potential power terminal 42, an output terminal 44 and a control terminal 46 that contains a gate terminal 46g. Further, the semiconductor device 10 includes, as shown in FIG. 1 to FIG. 4, four heat sinks 50, 52, 54 and 56, a joint part 58, two terminals 60 and 62, a solder 64, and a resin part 66.

The IGBT element 20 and the FWD 28 constitute an upper arm of the upper and lower arms and the IGBT element 30 and the FWD 38 constitute a lower arm of the upper and lower arms.

The IGBT element 20 includes, as shown in FIG. 2 and FIG. 3, a collector electrode 22 on a lower surface side and an emitter electrode 24 and a gate electrode 26 on an upper surface side.

On the lower surface side of the IGBT element 20, the first heat sink 50 is disposed. The collector electrode 22 of the IGBT element 20 is electrically and mechanically connected with a surface 50a on an upper side of the first heat sink 50 via the solder 64. In an embodiment shown in FIG. 2, also a cathode electrode of the FWD element 28 is connected with the surface 50a on the upper side of the first heat sink 50.

As shown in FIG. 2, the first heat sink 50 is a substantially rectangular metal plate and includes the high potential power terminal 40 that extends from a side of the rectangle in the Y direction. The first heat sink 50 may be formed of a single heteromorphous lead frame together with the high potential power terminal 40 and the like. Alternatively, the high potential power terminal 40 may be formed in a separate body from the first heat sink 50 and attached to the first heat sink 50. The high potential power terminal 40 is connected electrically with the IGBT element 20 and the FWD element 28 via the first heat sink 50. A part of the high potential power terminal 40 is, as shown in FIG. 2, withdrawn externally from a side surface of the resin part 66 (a side surface having the Y direction as a normal line).

A surface 50b on a lower side of the first heat sink 50 is, as shown in FIG. 3 and FIG. 4, exposed from a surface 66a on a lower side of the resin part 66. Thus, heat generated by the IGBT element 20 and the FWD element 28 can be externally radiated from the surface 50b of the first heat sink 50. In an embodiment shown in FIG. 3, although the surface 50b on the lower side of the first heat sink 50 is flush with the surface 66a on the lower side of the resin part 66, the surface 50b may include an offset in the Z direction with respect to the surface 66a.

On a top surface side of the IGBT element 20, the first terminal 60 is disposed such that the first terminal 60 does not overlap with the gate electrode 26 in the Z direction but faces the emitter electrode 24. The first terminal 60 is a flat metal plate (metal block) but may include a bent part. A surface on a lower side of the first terminal 60 is electrically and mechanically connected with the emitter electrode 24 of the IGBT element 20 via the solder 64. To the surface on the lower side of the first terminal 60, also an anode electrode of the FWD element 28 is connected. The first terminal 60 has a relay function for electrically connecting the IGBT element 20 and the FWD element 28 with a second heat sink 52 and a function for securing a height for performing wire bonding to the gate electrode 26.

The gate electrode 26 is connected with the gate terminal 46g of the control terminal 46 according to the upper arm via a bonding wire 48. The control terminal 46 according to the upper arm may be formed of the single heteromorphous lead frame together with the first heat sink 50, the high potential power terminal 40 and the like. The control terminal 46 according to the upper arm may include, in addition to the gate terminal 46g, a terminal connected with a temperature measurement diode, a sense emitter and the like. The control terminal 46 according to the upper arm is, as shown in FIG. 1 and FIG. 2, externally withdrawn from a side surface (a side surface having the Y direction as a normal line) on an opposite side from a withdrawing side of the high potential power terminal 40 in the resin part 66.

The second heat sink 52 is disposed on a surface on an upper side of the first terminal 60. A surface 52a on a lower side of the second heat sink 52 is electrically and mechanically connected with the surface on the upper side of the first terminal 60 via the solder 64. Thus, the second heat sink 52 is connected electrically with the emitter electrode 24 of the IGBT element 20 and the anode electrode of the FWD element 28 via the first terminal 60.

The second heat sink 52 is a substantially rectangular metal plate and is disposed such that an almost entire part overlaps with the first heat sink 50 in a top view (a downward view in the Z direction). As shown in FIG. 2, the second heat sink 52 has a substantially same rectangular shape as an external shape of the first heat sink 50. A surface 52b on the upper side of the second heat sink 52 is exposed from a surface 66b on the upper side of the resin part 66. Thus, the heat generated by the IGBT element 20 and the FWD element 28 can be externally radiated from the surface 52b of the second heat sink 52 via the first terminal 60. In the embodiment shown in FIG. 3 and FIG. 4, although the surface 52b on the upper side of the second heat sink 52 is flush with the surface 66b on the upper side of the resin part 66, the surface 52b may include an offset with respect to the surface 66b in the Z direction.

In the second heat sink 52, a first joint part 58a that is one element of the joint part 58 is integrally disposed. However, the first joint part 58a may be formed in a separate body from the second heat sink 52 and attached to the second heat sink 52. The first joint part 58a extends toward the IGBT element 30 in the X direction.

The IGBT element 30 includes, as shown in FIG. 2 and FIG. 3, a collector electrode 32 on a lower surface side and an emitter electrode 34 and a gate electrode 36 on an upper surface side. The IGBT element 30 is aligned with the IGBT element 20 in the X direction. In the embodiment shown in FIG. 3, although the IGBT element 30 is disposed in a relationship that the IGBT element 30 is not offset with respect to the IGBT element 20 in the Y direction, it may have an offset in the Y direction.

On a lower surface side of the IGBT element 30, a third heat sink 54 is disposed. The collector electrode 32 of the IGBT element 30 is electrically and mechanically connected with a surface 54a on an upper side of the third heat sink 54 via the solder 64. In the embodiment shown in FIG. 2, also a cathode electrode of the FWD element 38 is connected with the surface 54a on the upper side of the third heat sink 54.

The third heat sink 54 is, as shown in FIG. 2, a substantially rectangular metal plate and provided with the output terminal 44 that extends from one side of the rectangle in the Y direction. The third heat sink 54 may be formed of a single heteromorphous lead frame together with the output terminal 44 and the like. Alternatively, the output terminal 44 may be formed in a separate body from the third heat sink 54 and attached to the third heat sink 54. Thus, the output terminal 44 is connected electrically with the IGBT element 30 and the FWD element 38 via the third heat sink 54. A part of the output terminal 44 is, as shown in FIG. 2, withdrawn externally from a side surface of the resin part 66 (a side surface having the Y direction as the normal line). The side surface of the resin part 66 from which the output terminal 44 is withdrawn is the same as the side surface of the resin part 66 from which the high potential power terminal 40 is withdrawn.

A surface 54b on a lower side of the third heat sink 54 is, as shown in FIG. 3 and FIG. 4, exposed from the surface 66a on the lower side of the resin part 66. Thus, the heat generated by the IGBT element 30 and the FWD element 38 can be externally radiated from the surface 54b of the third heat sink 54. In the embodiment shown in FIG. 3 and FIG. 4, although the surface 54b on the lower side of the third heat sink 54 is flush with the surface 66a on the lower side of the resin part 66, the surface 54b may have an offset with respect to the surface 66a in the Z direction.

In the third heat sink 54, a second joint part 58b that is one element of the joint part 58 is integrally disposed. However, the second joint part 58b may be formed in a separate body from the third heat sink 54 and attached to the third heat sink 54. In the embodiment shown in FIG. 3, the second joint part 58b extends in an upper direction toward the surface 56a on a lower side of a fourth heat sink 56 and extends to the IGBT element 20 side in the X direction. The second joint part 58b is, as shown in FIG. 3, electrically and mechanically connected with the first joint part 58a via the solder 64. The second joint part 58b and the first joint part 58a are formed between the second heat sink 52 and the third heat sink 54 in the X direction, and mutually connected electrically and mechanically between the second heat sink 52 and the third heat sink 54 in the X direction.

On a top surface side of the IGBT element 30, a second terminal 62 is disposed such that the second terminal 62 does not overlap with the gate electrode 36 in the Z direction but faces the emitter electrode 34. The second terminal 62 is a flat metal plate (metal block) but may have the bent part. A surface on a lower side of the second terminal 62 is electrically and mechanically connected with the emitter electrode 34 of the IGBT element 30 via the solder 64. To the surface on the lower side of the second terminal 62, also an anode electrode of the FWD element 38 is connected. The second terminal 62 has a relay function for electrically connecting the IGBT element 30 and the FWD element 38 with the fourth heat sink 56 and a function for securing a height for performing wire bonding to the gate electrode 36.

The gate electrode 36 is connected with the gate terminal 46g of the control terminal 46 according to the lower arm via the bonding wire 48. The control terminal 46 according to the lower arm may be formed of a single heteromorphous lead frame together with the third heat sink 54, the output terminal 44 and the like. The control terminal 46 according to the lower arm may include, in addition to the gate terminal 46g, a terminal that is connected with the temperature measurement diode, the sense emitter and the like. The control terminal 46 according to the lower arm is, as shown in FIG. 1 and FIG. 2, externally withdrawn from a side surface (a side surface having the Y direction as a normal line) on an opposite side from a withdrawing side of the high potential power terminal 40 in the resin part 66.

The fourth heat sink 56 is disposed on a surface on an upper side of the second terminal 62. The surface 56a on the lower side of the fourth heat sink 56 is electrically and mechanically connected with the surface on the upper side of the second terminal 62 via the solder 64. Thus, the fourth heat sink 56 is connected electrically with the emitter electrode 34 of the IGBT element 30 and the anode electrode of the FWD element 38 via the second terminal 62.

The fourth heat sink 56 is a substantially rectangular metal plate and disposed such that an almost entire part overlaps with the third heat sink 54 in a top view (a downward view in the Z direction). As shown in FIG. 2, the fourth heat sink 56 has a rectangular shape substantially the same as an external shape of the third heat sink 54. A surface 56b on an upper side of the fourth heat sink 56 is exposed from the surface 66b on the upper side of the resin part 66. Thus, heat generated by the IGBT element 30 and the FWD element 38 can be externally radiated from the surface 56b of the fourth heat sink 56 via the second terminal 62. In the embodiment shown in FIG. 3 and FIG. 4, although the surface 56b on the upper side of the fourth heat sink 56 is flush with the surface 66b on the upper side of the resin part 66, the surface 56b may have the offset in the Z-direction.

The fourth heat sink 56 includes a body part 56c that defines the surfaces 56a and 56b and an extension part 56d that extends from a side surface of the body part 56c to an IGBT element 20 side in the X direction. The extension part 56d is formed integrally with the body part 56c. However, the extension part 56d may be formed in a separate body from the body part 56c and attached to the body part 56c. The extension part 56d is formed, in the same manner as the joint part 58, between the body part 56c of the fourth heat sink 56 and the second heat sink 52 (the body part excluding the first joint part 58a) in the X-direction. However, the extension part 56d has the offset with respect to the joint part 58 in the Y direction so as not to interfere with the joint part 58.

The low potential power terminal 42 is connected electrically with the fourth heat sink 56. Specifically, as shown in FIG. 4, the low potential power terminal 42 is connected electrically and mechanically with the extension part 56d of the fourth heat sink 56 via the solder 64. The low potential power terminal 42 may be formed of the single heteromorphous lead frame together with the third heat sink 54, the output terminal 44, the control terminal 46 according to the lower arm and the like. As shown in FIG. 2, a part of the low potential power terminal 42 is externally withdrawn from the side surface of the resin part 66 (a side surface having a normal line in the Y direction). The side surface of the resin part 66 from which the low potential power terminal 42 is withdrawn is the same as the side surface of the resin part 66 from which the high potential power terminal 40 and the output terminal 44 are withdrawn.

The low potential power terminal 42 is disposed in a region 70 (the body part excluding the first joint part 58a) between the body part 56c of the fourth heat sink 56 and the second heat sink 52 in the X-direction, that is, in the region 70 in which the extension part 56d is disposed. Thus, as shown in FIG. 2, the high potential power terminal 40, the low potential power terminal 42, and the output terminal 44 are disposed in a positional relationship in which the low potential power terminal 42 is located between the output terminal 44 and the high potential power terminal 40 in the X direction. In the illustrated embodiment, an entirety of the low potential power terminal 42 is disposed in a region between the body part 56c of the fourth heat sink 56 and the second heat sink 52 (the body part excluding the first joint part 58a).

The resin part 66 integrally seals the IGBT elements 20 and 30, the FWD elements 28 and 38, a part of the high potential power terminal 40, a part of the low potential power terminal 42, a part of the output terminal 44, a part of the control terminal 46, a part excluding the surfaces 50b, 52b, 54b and 56b in the respective heat sinks 50, 52, 54 and 56, the joint part 58 and the respective terminals 60 and 62. In the illustrated embodiment, the resin part 66 is formed into an external shape of a substantially a cuboid. As described above, the high potential power terminal 40, the low potential power terminal 42, and the output terminal 44 are, as shown in FIG. 2, withdrawn from the side surface of the resin part 66 in the Y direction. Although withdrawing positions of the high potential power terminal 40, the low potential power terminal 42, and the output terminal 44 on the side surface of resin part 66 may be optional positions in the Z direction, for example, these may be a proximity of a center on the side surface of the resin part 66 in the Z direction (see FIG. 6C).

The semiconductor device 10 configured like this is a so-called 2-in-1 package including integrally two IGBT elements 20 and 30 that constitute the upper and lower arms (including in the single resin part 66). Further, since on both sides in the Z direction of each of the IGBT elements 20 and 30, the heat sinks 50, 52, 54 and 56 are disposed, the heat from the IGBT elements 20 and 30 can be radiated from the both sides in the Z direction, that is, this is a configuration excellent in the heat radiation property.

Figure 5:
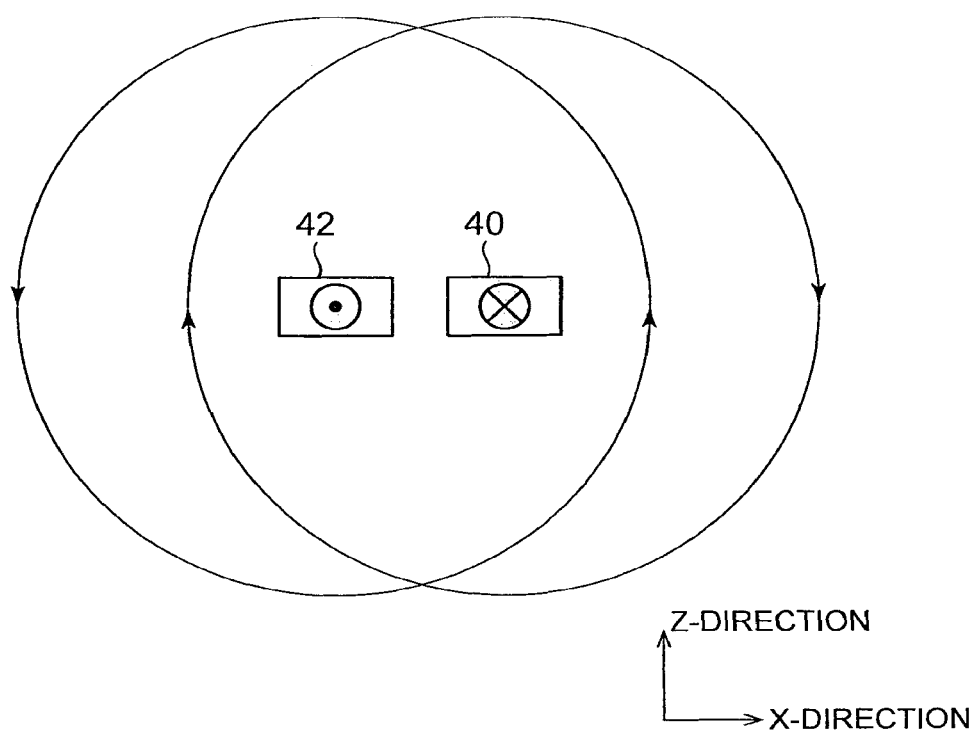
FIG. 5 is a diagram that schematically shows a principle of magnetic flux cancellation between a high potential power terminal and a low potential power terminal.

Further, since the high potential power terminal 40 and the low potential power terminal 42 are disposed adjacently in the X direction (without the output terminal 44 therebetween), compared with a configuration in which the output terminal 44 is disposed between the high potential power terminal 40 and the low potential power terminal 42 in the X direction, a distance between the high potential power terminal 40 and the low potential power terminal 42 in the X direction can be shortened. Thus, a surge voltage generated during switching of the IGBT elements 20 and 30 can be reduced. Specifically, as shown in FIG. 5, since directions of currents that flow in the high potential power terminal 40 and the low potential power terminal 42 are opposite with each other, when the high potential power terminal 40 and the low potential power terminal 42 are disposed in the proximity of each other, an effect of cancelling a magnetic flux can be increased. Thus, since a parasitic inductance can be reduced, the surge voltage can be reduced.

Further, since the first heat sink 50, the third heat sink 54, the high potential power terminal 40, the low potential power terminal 42, the output terminal 44, and the control terminal 46 according to the upper and lower arms can be formed of a single heteromorphous lead frame, the configuration has excellent productivity. However, a manufacturing method is not limited in certain ways.

Further, by making use of the region 70 in the X direction, by the joint part 58, the emitter electrode 24 of the IGBT element 20 and the anode electrode of the FWD element 28 are connected respectively with the collector electrode 32 of the IGBT element 30 and the cathode electrode of the FWD element 38. Further, the low potential power terminal 42 can be disposed by making use of a space (region 70) that the joint part 58 utilizes. Thus, a configuration that can realize miniaturization in the X direction is obtained.

Figure 6A:
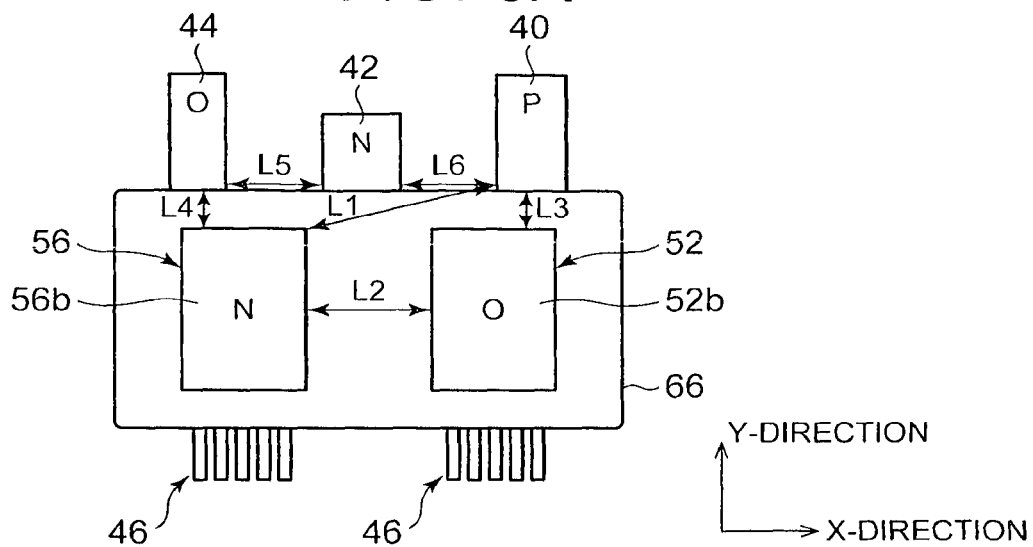
FIG. 6C is a diagram that shows a relationship of respective creepage distances in the semiconductor device of FIG. 1.
Figure 6B:
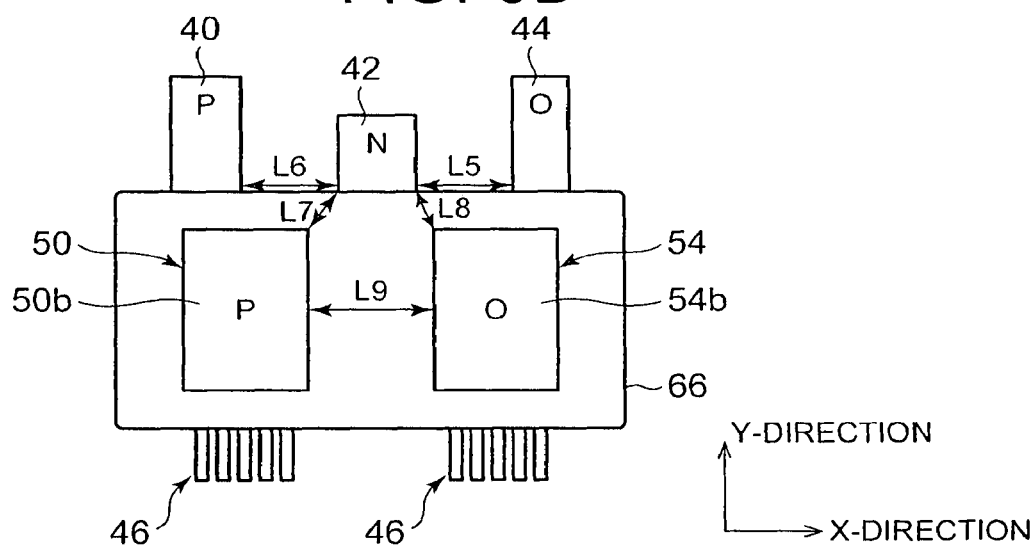
Figure 6C:
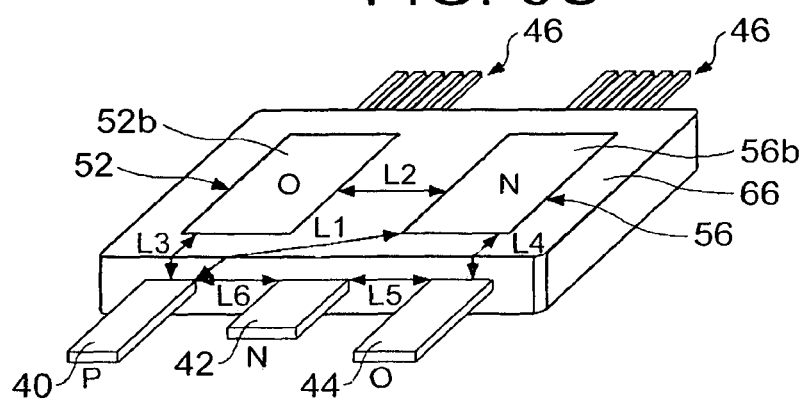

Each of FIG. 6A, FIG. 6B and FIG. 6C is a diagram that shows a relationship of the respective creepage distances in the semiconductor device 10. FIG. 6A shows a plan view when the semiconductor device 10 is viewed from an upper side, FIG. 6B shows a plan view when the semiconductor device 10 is viewed from a lower side, and FIG. 6C shows a perspective view when the semiconductor device 10 is viewed from an upper side.

In the present embodiment, each of the creepage distances is set so as to satisfy the following relationships. Among a conductor sites that are not sealed with the resin part 66 in the semiconductor device 10 (that is, a conductor site that is exposed from the resin part 66), when a part that becomes the same potential as the high potential power terminal 40 is set to a first potential part P, a part that becomes the same potential as the low potential power terminal 42 is set to a second potential part N, and a part that becomes the same potential as the output terminal 44 is set to a third potential part O, a first creepage distance L1, L6, L7 between the first potential part P and the second potential part N is longer than a second creepage distance L3, L9 between the first potential part P and the third potential part O, and longer than a third creepage distance L2, L4, L5, L8 between the second potential part N and the third potential part O. That is, a minimum value among L1, L6 and L7 is larger than a minimum value among L3, L9, L2, L4, L5 and L8. However, each of the creepage distances is set to be equal to or more than a lower limit (for example, a minimum creepage distance based on JIS standard). In FIG. 6A and FIG. 6B, although L1, L3, L4 and the like are shown in a flat layout, actually, as shown in FIG. 6C, these are distances along two surfaces of the resin part 66 (a front surface and a side surface on the upper side).

Therefore, according to the present embodiment, since the creepage distance between the first potential part P and the third potential part O or between the second potential part N and the third potential part O is shorter than the creepage distance between the first potential part P and the second potential part N, even when insulating performance is degraded due to deterioration of the resin part 66, likelihood of short-circuiting (short-circuiting of the upper and lower arms) between the first potential part P and the second potential part N can be reduced. That is, even when the insulating performance is degraded due to deterioration of the resin part 66, before the short-circuiting is caused between the first potential part P and the second potential part N, the short-circuiting can be caused between the first potential part P and the third potential part O (for example, between the collector and the emitter of the IGBT element 20) or between the second potential part N and the third potential part O (for example, between the collector and the emitter of the IGBT element 30). When the short-circuiting is caused between the first potential part P and the third potential part O or between the second potential part N and the third potential part O (that is, when the short-circuiting is caused between the collector and the emitter), a protection function is operated, and the short-circuiting of the upper and lower arms can be prevented thereby. For example, when the short-circuiting is caused between the first potential part P and the third potential part O, the IGBT element 30 is kept in an off state, and the upper and lower arms are prevented from being short-circuited thereby. Further, when the short-circuiting is caused between the second potential part N and the third potential part O, the IGBT element 20 is kept in the off state, and the upper and lower arms are prevented from being short-circuited thereby.

Figure 7A:
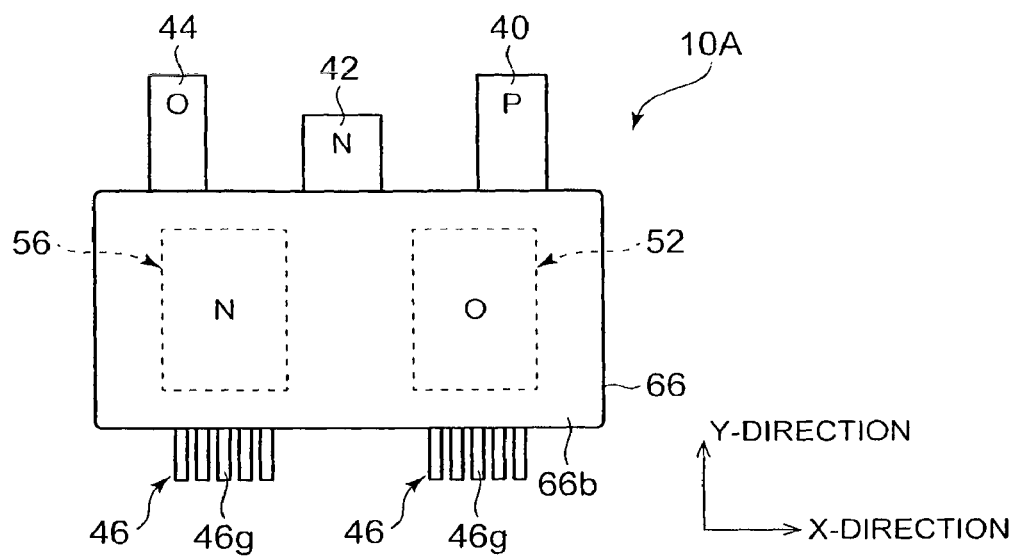
FIG. 7B is a diagram that shows a semiconductor device according to a variant embodiment of the first embodiment.
Figure 7B:
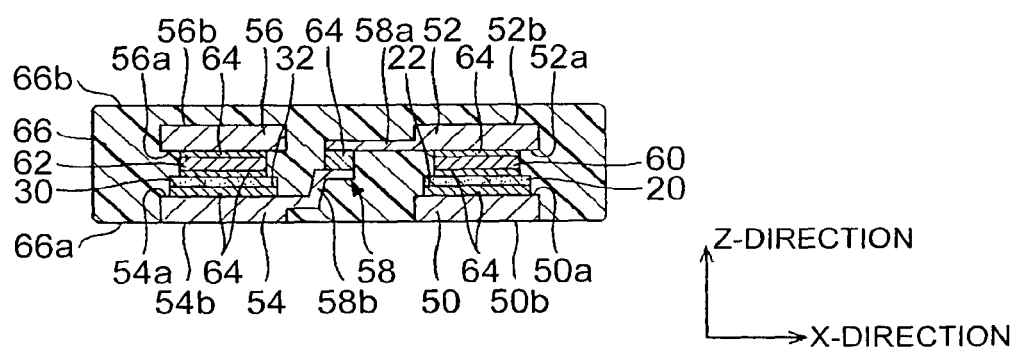

Each of FIG. 7A and FIG. 7B is a diagram that shows a semiconductor device 10A according to a variant embodiment of the first embodiment. FIG. 7A is a top view of the semiconductor device 10A, and FIG. 7B is a cross-sectional view of the semiconductor device 10A.

The semiconductor device 10A is different from the semiconductor device 10 according to the above-described first embodiment in a point that an entirety of the second heat sink 52 and an entirety of the fourth heat sink 56 are sealed in the resin part 66. In this case, since the creepage distances according to the second heat sink 52 and the fourth heat sink 56 (L1, L2 and the like in FIG. 6A and FIG. 6C) are not generated, these are not considered.

According to the embodiment shown in FIG. 7A and FIG. 7B, the second heat sink 52 and the fourth heat sink 56 work substantially as a bus bar (substantially, single-sided radiation due to the first heat sink 50 and the third heat sink 54). The respective terminals 60 and 62 may be omitted.

Figure 8A:
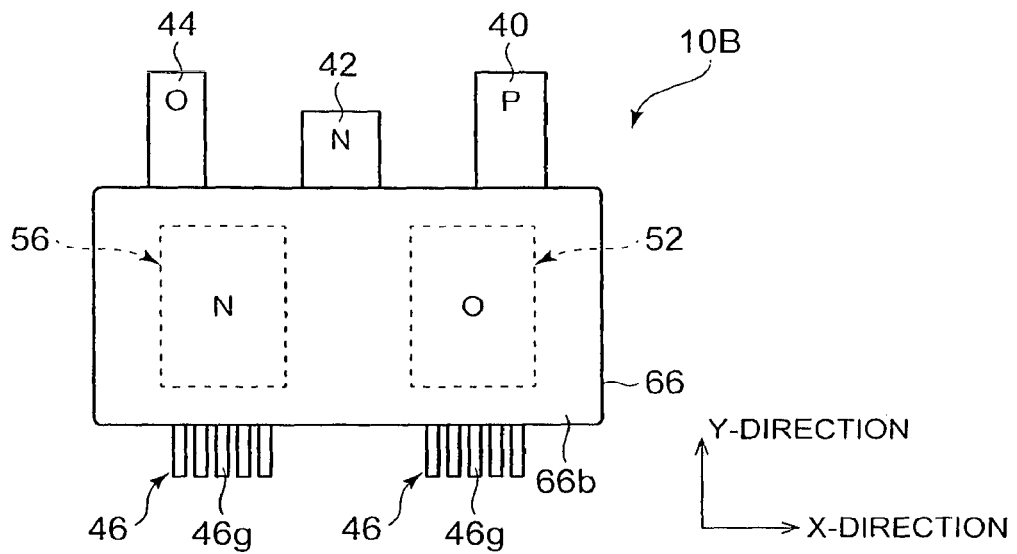
FIG. 8B is a diagram that shows a semiconductor device according to another variant embodiment of the first embodiment.
Figure 8B:
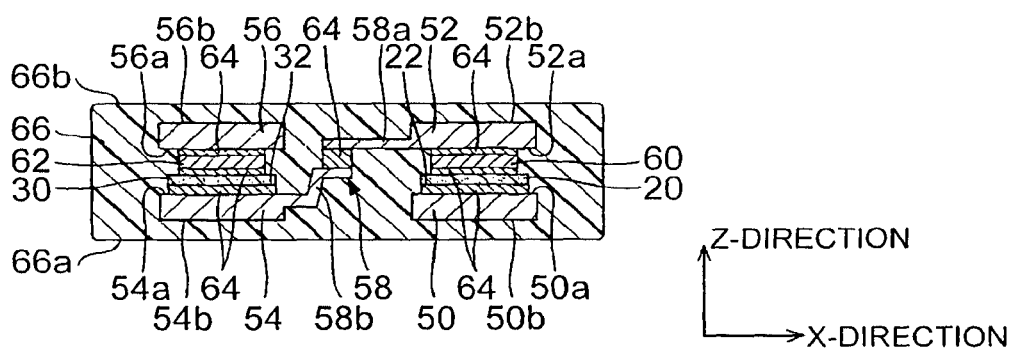

Each of FIG. 8A and FIG. 8B is a diagram that shows a semiconductor device 10B according to another variant embodiment of the first embodiment. FIG. 8A is a top view of the semiconductor device 10B, and FIG. 8B is a cross-sectional view of the semiconductor device 10B.

The semiconductor device 10B is different from the semiconductor device 10 according to the above-described first embodiment in a point that an entirety of the respective heat sinks 50, 52, 54 and 56 is sealed in the resin part 66. In this case, since the creepage distances according to the respective heat sinks 50, 52, 54 and 56 (L1, L2 and the like in FIG. 6A and FIG. 6C) are not generated, these are not considered. That is, the creepage distances according to the high potential power terminal 40, the low potential power terminal 42 and the output terminal 44 (for example, L5, L6 in FIG. 6A, FIG. 6B and FIG. 6C) may be considered. That is, in this case, a condition of L6>L5 may be set.

In the embodiment shown in FIG. 8A and FIG. 8B, the second heat sink 52, the fourth heat sink 56 and the like function substantially as the bus bar. The respective terminals 60 and 62 may be omitted.

Figure 9:
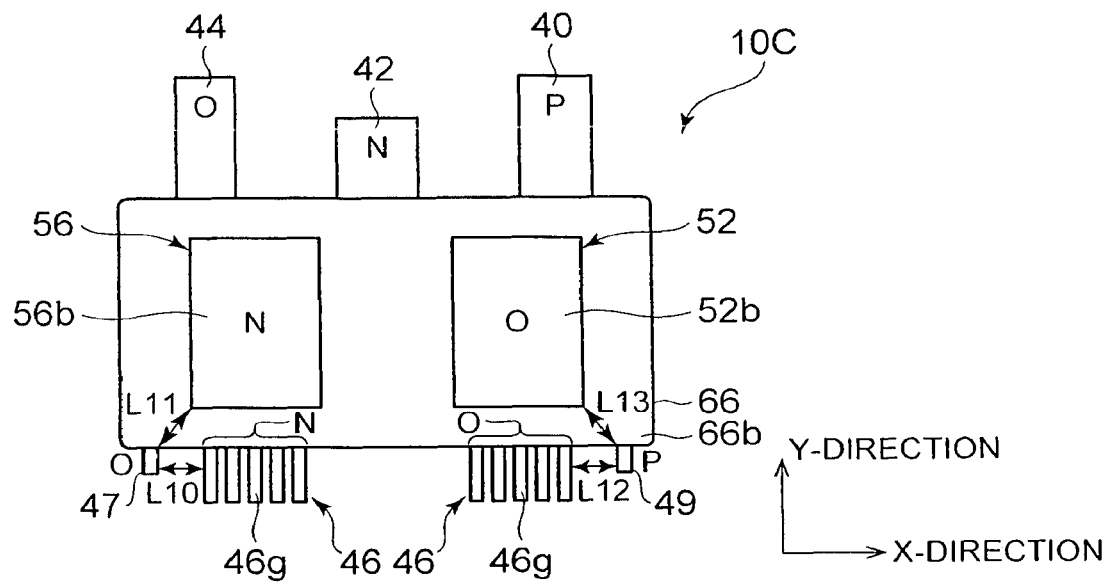
FIG. 9 is a top view that shows a semiconductor device according to another variant embodiment of the first embodiment.

FIG. 9 is a top view that shows a semiconductor device 10C according to another variant embodiment of the first embodiment.

The semiconductor device 10C is different from the semiconductor device 10 according to the above-described first embodiment in a point that new terminals 47 and 49 are exposed from the resin part 66. In the embodiment shown in FIG. 9, the terminal 47 may be formed in the third heat sink 54 and forms the third potential part O. The terminal 49 may be formed in the first heat sink 50 and forms the first potential part P. The terminals 47 and 49 may be used for detecting a voltage. In this case, the creepage distances according to the terminals 47 and 49 may be additionally considered. For example, a creepage distance L10 between the terminal 47 and the control terminal 46 (that forms the second potential part N), a creepage distance L11 between the terminal 47 and the surface 56b of the fourth heat sink 56, a creepage distance L12 between the terminal 49 and the control terminal 46 (forms the third potential part O), a creepage distance L13 between the terminal 49 and the surface 52b of the second heat sink 52 and the like may be additionally considered.

Thus, number and kind of terminals that are exposed from the resin part 66, a side to be exposed and the like are optional.

Figure 10:
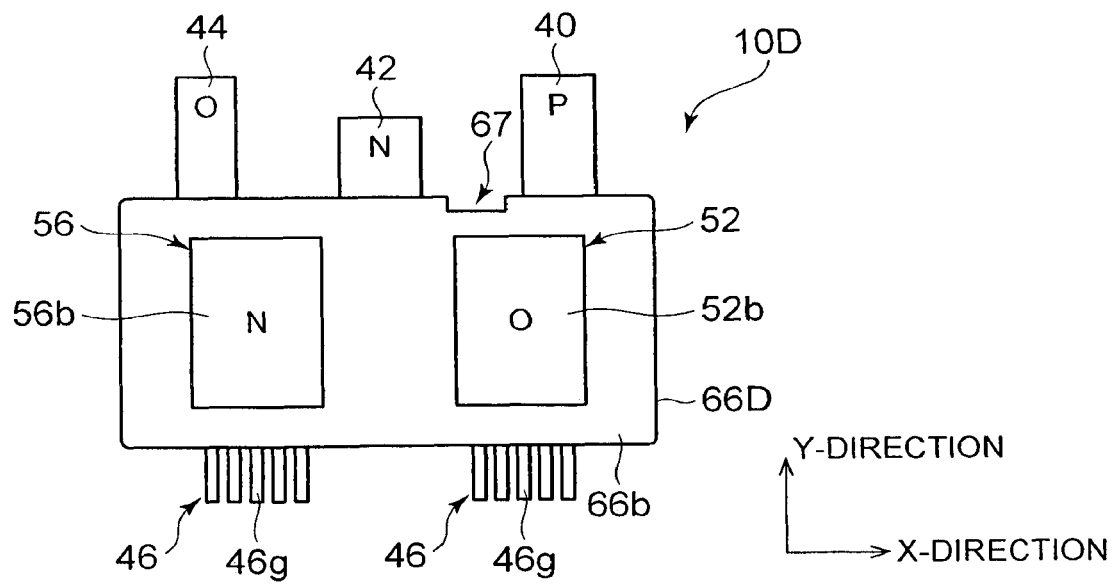
FIG. 10 is a top view that shows a semiconductor device according to another variant embodiment of the first embodiment.

FIG. 10 is a top view that shows a semiconductor device 10D according to another variant embodiment of the first embodiment.

The semiconductor device 10D is different from the semiconductor device 10 according to the above-described first embodiment in a point that the resin part 66 is substituted with a resin part 66D. The resin part 66D includes a recess part 67 on a side surface. The recess part 67 is formed between the low potential power terminal 42 and the high potential power terminal 40. Thus, the creepage distance between the low potential power terminal 42 and the high potential power terminal 40 can be efficiently increased, and the relationship of the above-described respective creepage distances becomes likely to be satisfied. The recess part 67 may be formed only in a position range that defines the creepage distance in the Z direction. Further, between the low potential power terminal 42 and the high potential power terminal 40, in place of the recess part 67, a protrusion part may be formed. Further, in a way of the same thinking, on the surface 66b on an upper side of the resin part 66D (or the resin part 66) or the surface 66a on a lower side thereof, the recess part or the protrusion part is formed, and also the creepage distance between the first potential part P and the second potential part N can be increased thereby.

Figure 11:
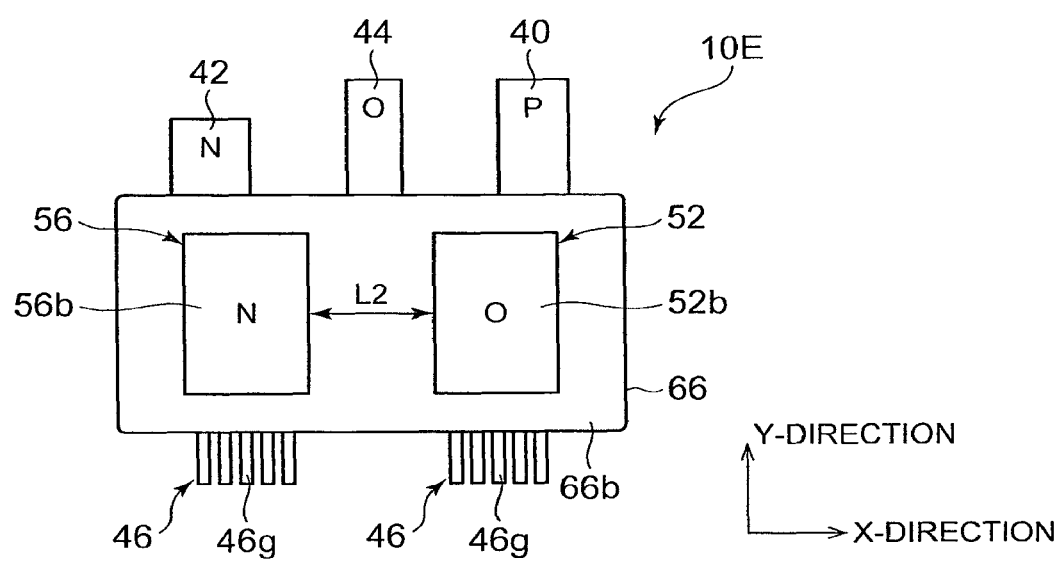
FIG. 11 is a top view that shows a semiconductor device according to another variant embodiment of the first embodiment.

FIG. 11 is a top view that shows a semiconductor device 10E according to another variant embodiment of the first embodiment.

The semiconductor device 10E is different from the semiconductor device 10 according to the above-described first embodiment in a point that an arrangement of the high potential power terminal 40, the low potential power terminal 42 and the output terminal 44 is different in the X direction. That is, in the embodiment shown in FIG. 11, the output terminal 44 is disposed between the high potential power terminal 40 and the low potential power terminal 42 in the X direction. Thus, an order of arrangement of the high potential power terminal 40, the low potential power terminal 42 and the output terminal 44 is optional. The embodiment shown in FIG. 11 is, as described above, a configuration that is disadvantageous than the semiconductor device 10 according to the above-described first embodiment from a view point of the parasitic inductance but is a configuration that is advantageous from a viewpoint of securing a necessary creepage distance between the high potential power terminal 40 and the low potential power terminal 42. In other words, the semiconductor device 10 according to the above-described first embodiment makes it possible to keep a proper creepage distance between the high potential power terminal 40 and the low potential power terminal 42 while reducing the parasitic inductance.

Figure 12A:
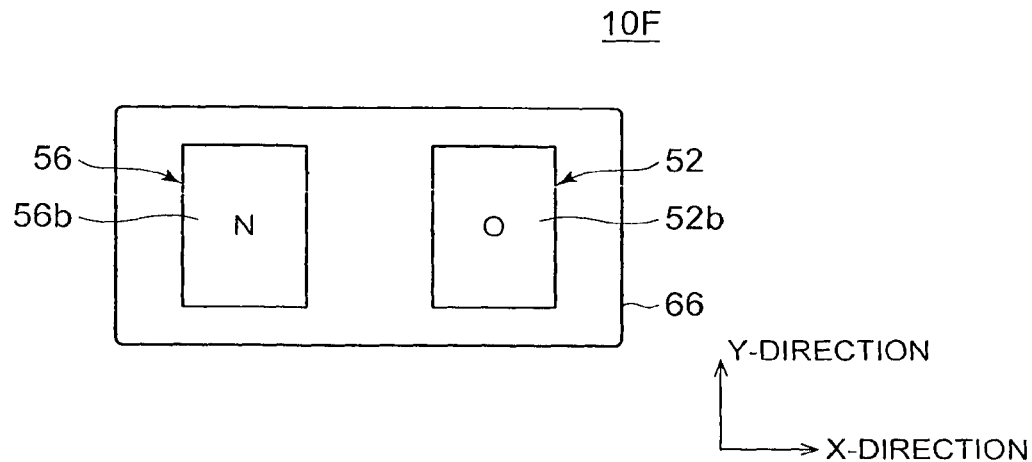
FIG. 12C is a diagram that shows a semiconductor device according to another variant embodiment of the first embodiment.
Figure 12B:
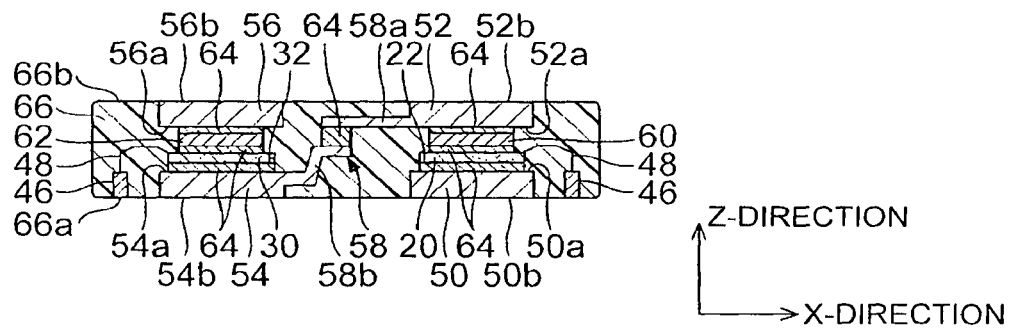
Figure 12C:
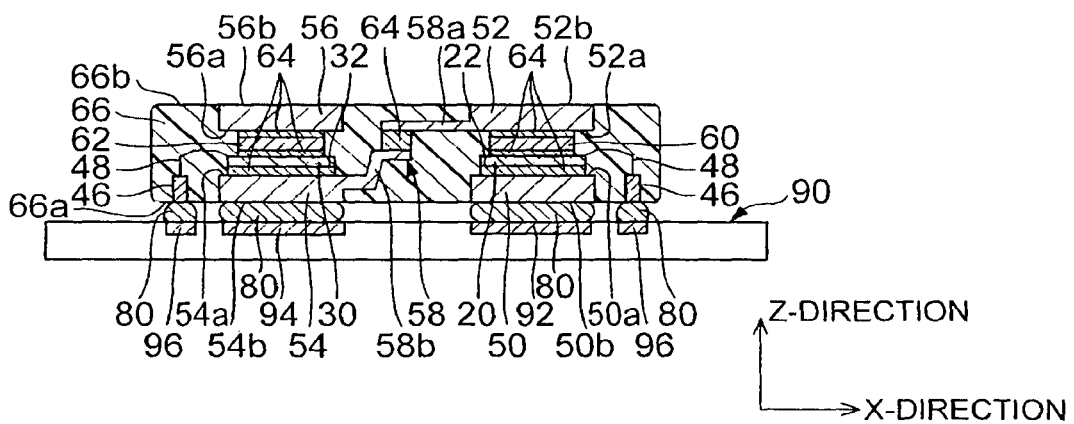

Each of FIG. 12A, FIG. 12B and FIG. 12C is a diagram that shows a semiconductor device 10F according to another variant embodiment of the first embodiment. FIG. 12A is a top view of the semiconductor device 10F, FIG. 12B is a cross-sectional view of the semiconductor device 10F, and FIG. 12C is a cross-sectional view that schematically shows a state of a printed-wiring board on which the semiconductor device 10F is mounted.

The semiconductor device 10F is different from the semiconductor device 10 according to the above-described first embodiment in a point that the semiconductor device 10F is a surface mount type as shown in FIG. 12C. That is, the semiconductor device 10F is mounted on a surface of a printed-wiring board 90. In the printed-wiring board 90, conductor parts (or conductor patterns) 92, 94 and 96 are formed. The surface 50b on the lower side of the first heat sink 50 is electrically and mechanically connected with the conductor part 92 via the solder (or conductor bump or the like) 80. Further, the control terminal 46 according to the IGBT element 20 is electrically and mechanically connected with the conductor part 96 via the solder (or conductor bump or the like) 80. Similarly, the surface 54b on the lower side of the third heat sink 54 is electrically and mechanically connected with the conductor part 94 via the solder (or conductor bump or the like) 80. Further, the control terminal 46 according to the IGBT element 30 is electrically and mechanically connected with the conductor part 96 via the solder (or conductor bump or the like) 80.

Also in the embodiment shown in FIG. 12A, FIG. 12B and FIG. 12C, the respective creepage distances in the semiconductor device 10F are set so as to have the above-described relationships. In particular, in the case of the semiconductor device 10F, functions of the high potential power terminal 40 and the output terminal 44 (external connection function) are realized by the surface 50b on the lower side of the first heat sink 50 and the surface 54b on the lower side of the third heat sink 54, and the high potential power terminal 40 and the output terminal 44 are unnecessary. Therefore, since the creepage distances according to the high potential power terminal 40 and the output terminal 44 are not generated, these are not considered.

Figure 13A:
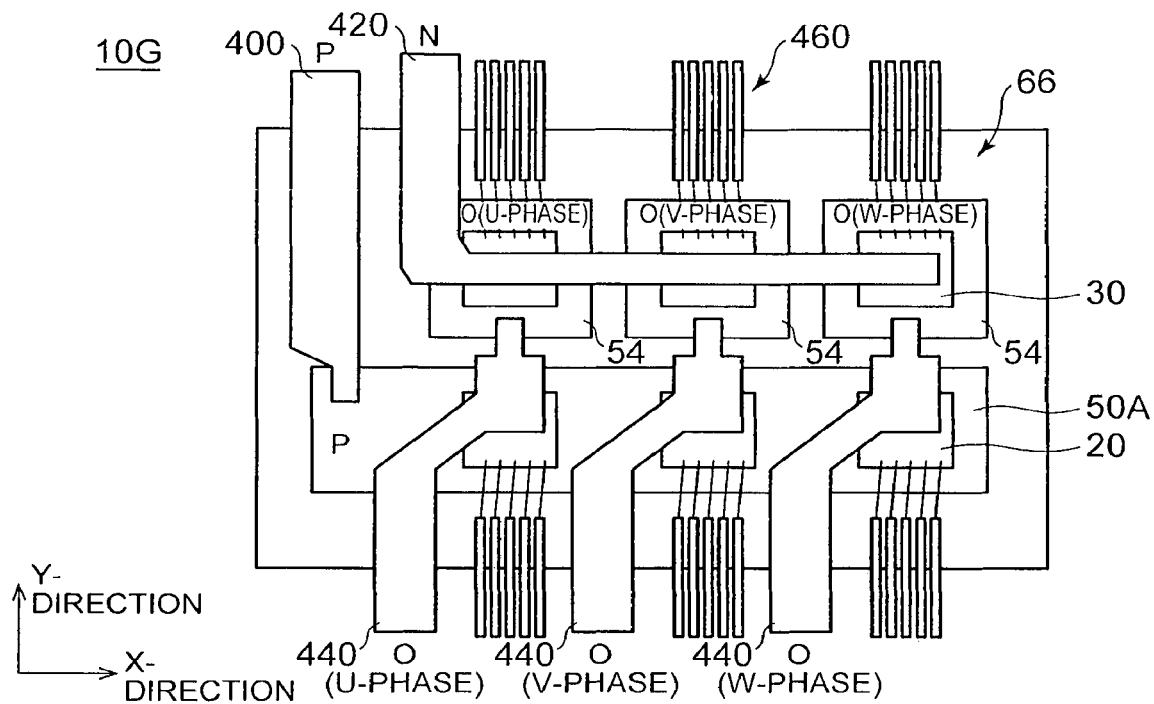
FIG. 13B is a top view that shows a semiconductor device according to another variant embodiment of the first embodiment.
Figure 13B:
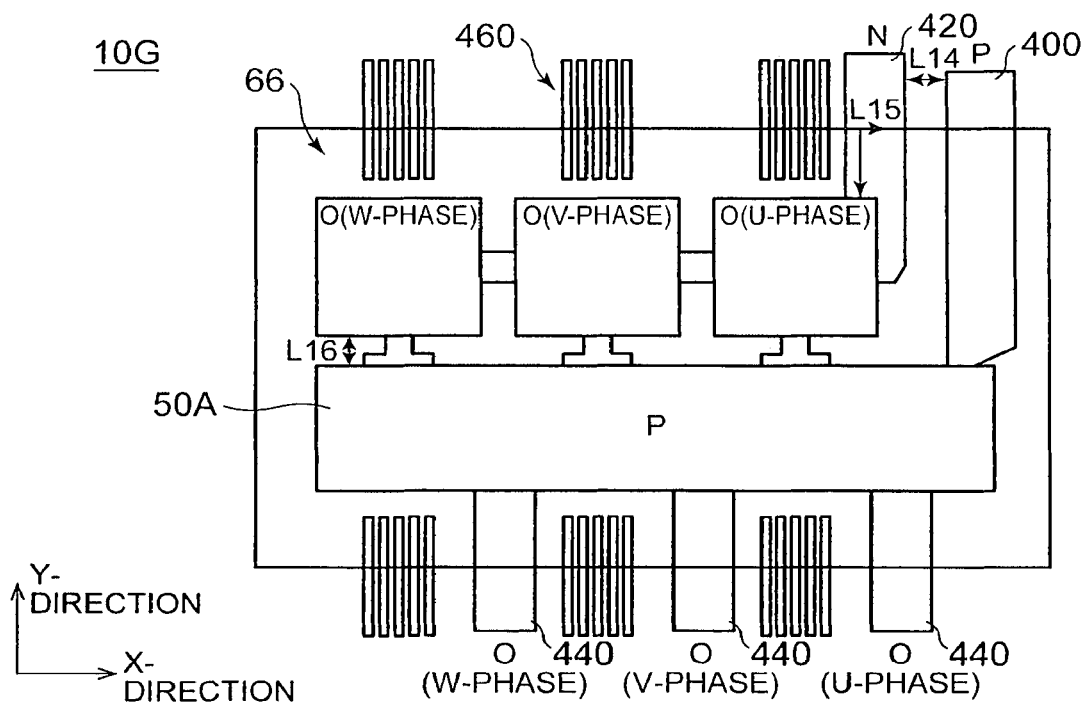

Each of FIG. 13A and FIG. 13B is a diagram that shows a semiconductor device 10G according to another variant embodiment of the first embodiment. FIG. 13A is a plan view when the semiconductor device 10G is viewed from an upper side, and FIG. 13B is a plan view when the semiconductor device 10G is viewed from a lower side. In FIG. 13A and FIG. 13B, the resin part 66 is shown in a perspective view such that an inside of the resin part can be viewed.

The semiconductor device 10G is different from the semiconductor device 10 according to the above-described first embodiment mainly in a point that, as shown in FIG. 13A and FIG. 13B, the semiconductor device 10G is a so-called 6 in 1 package that includes integrally (includes in a single resin part 66) the IGBT elements 20 and 30 of the respective upper and lower arms of three-phases (U-phase, V-phase, W-phase). Further, the semiconductor device 10G is different from the semiconductor device 10 according to the above-described first embodiment, which has the double-sided heat radiation configuration, in a point that, as shown in FIG. 13A and FIG. 13B, the semiconductor device 10G has a single-sided heat radiation configuration. However, in the semiconductor device 10G, also a double-sided heat radiation configuration can be adopted. That is, in the 6-in-1 package, also a double-sided heat radiation configuration can be adopted.

The IGBT elements 20 of the respective phases are mounted on a surface of a common first heat sink 50A. Further, the IGBT elements 30 of the respective phases are mounted on the separate third heat sinks 54, respectively. A high potential power terminal 400 functions as the bus bar and one end thereof is electrically and mechanically connected with the first heat sink 50A. The other end of the high potential power terminal 400 is externally exposed from the resin part 66. A low potential power terminal 420 functions as the bus bar and one end thereof is electrically and mechanically connected with the emitter electrodes of the IGBT elements 30 of the respective phases. The other end of the low potential power terminal 420 is externally exposed from the resin part 66. The high potential power terminal 400 and the low potential power terminal 420 are preferably externally exposed adjacently from the resin part 66 as shown in FIG. 13A and FIG. 13B. Thus, as described above, the effect of cancelling the magnetic flux can be improved and the parasitic inductance can be reduced. However, also in this case, a creepage distance L14 between the high potential power terminal 400 and the low potential power terminal 420 is set larger than a minimum value of the respective creepage distances (for example, L16) between the first potential part P and the third potential part O or a minimum value of the respective creepage distances (for example, L15) between the second potential part N and the third potential part O. In the embodiment shown in FIG. 13A and FIG. 13B, output terminals 440 of the respective phases are externally exposed from the resin part 66 on a side surface on an opposite side in the Y direction from a side surface from which the high potential power terminal 400 and the low potential power terminal 420 in the resin part 66 are exposed.

Although the embodiment shown in FIG. 13A and FIG. 13B has a single-sided heat radiation configuration in the so-called 6 in 1 package, also in the single-sided heat radiation configuration in the 2 in 1 package, regarding the high potential power terminal, the low potential power terminal and the output terminal, a similar configuration can be adopted. In this case, the output terminal 440 becomes one, and the low potential power terminal 420 is connected to the emitter electrode of a single IGBT element 30.

Next, another embodiment (second embodiment) will be described.

Figure 14A:
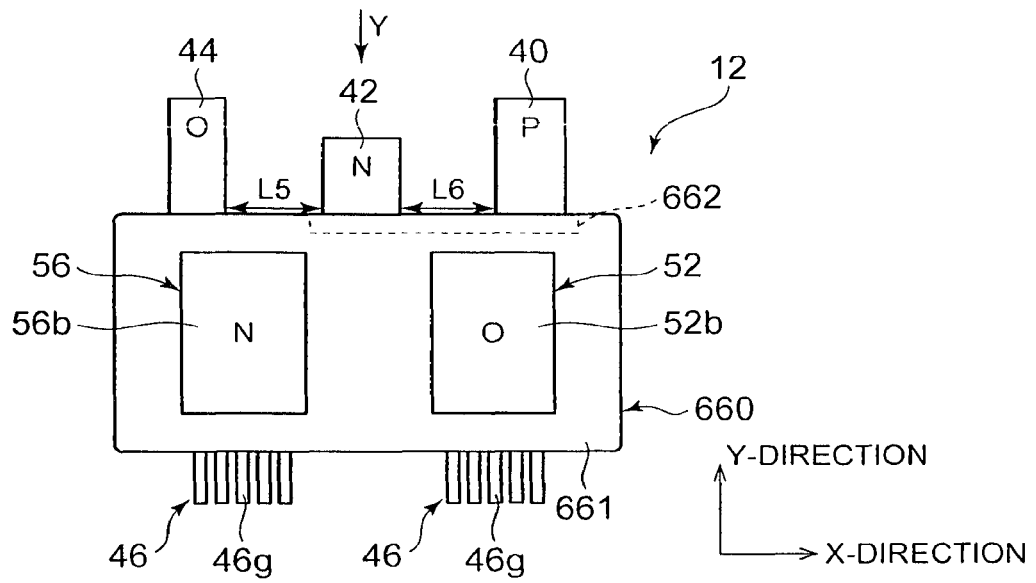
FIG. 14B is a diagram that shows a semiconductor device according to a second embodiment.
Figure 14B:
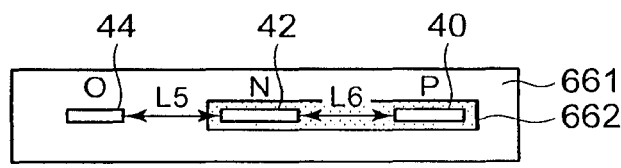

Each of FIG. 14A and FIG. 14B is a diagram that shows a semiconductor device 12 according to the second embodiment. FIG. 14A is a top view of the semiconductor device 12, and FIG. 14B is a side view of the semiconductor device 12 taken in a direction of arrow Y of FIG. 14A. The semiconductor device 12 according to the second embodiment is different from the semiconductor device 10 according to the above-described first embodiment mainly in a point that the resin part 66 is substituted with a resin part 660. Other configurations may be the same and descriptions thereof are omitted. Further, also regarding the various variant embodiments to the above-described first embodiment, a way of thinking described below (formation of high comparative tracking index part 662 (high CTI part 662)) can be applied.

The resin part 660 includes a body part 661 and the high CTI part 662. The high CTI part 662 is formed of a material having the CTI higher than that of the body part 661. In such a manner that a material group I is a group of materials having the CTI of 600 or more, and a material group II is a group of materials having the CTI of 400 or more and less than 600, a relationship between the material group and the CTI are determined. Which material group is selected may be determined by applying functional insulation of JISC 60664 (IEC60664). For example, according to JISC 60664, when a voltage effective value to be used and a degree of contamination are determined, regarding the material groups I, II, III or the like, the minimum creepage distances to be observed are determined. For example, when the degree of contamination of 2 and voltage effective value of 800 V are set, the minimum creepage distance according to the material group I of the resin is 4.0 mm and the minimum creepage distance according to the material group III of the resin is 8.0 mm. At this time, for example, in the embodiment shown in FIG. 14A and FIG. 14B, in the case where a site excluding the high CTI part 662 in the resin part 660 (that is, the body part 661) is formed of a material of the material group III, and in the case where the creepage distance L6 is smaller than 8.0 mm but is 4.0 mm or more, the high CTI part 662 may be formed of a material of the material group I.

The high CTI part 662 may be formed only in a necessary place in the resin part 660. For example, when the first creepage distance is smaller than the minimum creepage distance according to the material group of the body part 661, a site that defines the relevant first creepage distance is formed of a material of a material group having the minimum creepage distance that is the relevant first creepage distance or less (a material of the material group having higher CTI) and becomes the high CTI part 662.

Figure 15:
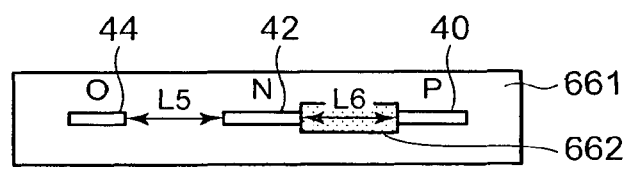
FIG. 15 is a diagram that shows a semiconductor device according to another variant example to the second embodiment.

Although the high CTI part 662 may be formed, as shown with a dotted line in FIG. 14A, only on a superficial layer part of the resin part 660, the high CTI part 662 may be formed with some degree of depth (Y direction). The high CTI part 662 may be additionally formed by potting a resin material having a corresponding CTI after formation of the body part 661, or the high CTI part 662 may be formed by coating the resin material having the corresponding CTI after formation of the body part 661. In the embodiment shown in FIG. 14A and FIG. 14B, since the creepage distance L6 between the high potential power terminal 40 and the low potential power terminal 42 is smaller than the minimum creepage distance according to the material group of the body part 661, the high CTI part 662 is formed between the high potential power terminal 40 and the low potential power terminal 42. The high CTI part 662 is formed, as shown in FIG. 14B, so as to surround a circumference of both the high potential power terminal 40 and the low potential power terminal 42 in a side view. However, as shown in FIG. 15, the high CTI part 662 may be formed only in an entire region between the high potential power terminal 40 and the low potential power terminal 42 in the X direction, or, under the condition that a necessary insulating property is satisfied, the high CTI part 662 may be formed only in a part of region between the high potential power terminal 40 and the low potential power terminal 42 in the X direction.

In the semiconductor device 12 according to the second embodiment, different from the semiconductor device 10 according to the above-described first embodiment, the first creepage distance between the first potential part P and the second potential part N may be smaller than a minimum value of the second creepage distance between the first potential part P and the third potential part O and may be smaller than a minimum value of the third creepage distance between the second potential part N and the third potential part O. However, in the present embodiment 2, the respective creepage distances are set so as to satisfy the following relationships. When the minimum value of the creepage distance between the first potential part P and the second potential part N is set to $L_1$, the minimum creepage distance according to a material between the first potential part P and the second potential part N (that is, a material of the high CTI part 662) is set to $L_1$ min, the minimum value of the creepage distance between the first potential part P and the third potential part O is set to $L_2$, the minimum creepage distance according to a material between the first potential part P and the third potential part O (that is, a material of the body part 661) is set to $L_2$ min, the minimum value of the creepage distance between the second potential part N and the third potential part O is set to $L_3$, and the minimum creepage distance according to a material of the CTI between the second potential part N and the third potential part O (that is, a material of the body part 661) is set to $L_3$ min, at least any one of the following two formulas is satisfied.

$$(L_2-L_2 \min)/L_2 \min < (L_1-L_1 \min)/L_1 \min$$

$$(L_3-L_3 \min)/L_3 \min < (L_1-L_1 \min)/L_1 \min$$

The two formulas described above are based on that the minimum creepage distance is represented by a linear proportional expression with respect to the voltage effective value. That is, the minimum creepage distance increases proportionally as the voltage effective value increases. The $(L_k-L_k \min)/L_k \min$ (k=1, 2, 3) in the above-described two formulas represents a margin with respect to the minimum creepage distance. For example, when the degree of contamination is set to 2 and the voltage effective value is set to 800 V, the minimum creepage distance according to the material group I of the resin is 4.0 mm. At this time, when the creepage distance is 6 mm, the margin is 1.5. Since the minimum creepage distance is in a proportional relationship with respect to the voltage effective value, the margin is a comparable parameter even when the voltage effective values are different. The margin is an indicator that shows that as the margin becomes closer to 1, the short-circuiting tends to occur. Therefore, when any one of the above-described two formulas is satisfied, the same effect as that of the above-described first embodiment can be obtained. That is, even when the insulating performance is degraded due to deterioration of the resin part 66, before the short-circuiting is caused between the first potential part P and the second potential part N, the short-circuiting can be caused between the first potential part P and the third potential part O (for example, between the collector and the emitter of the IGBT element 20) or between the second potential part N and the third potential part O (for example, between the collector and the emitter of the IGBT element 30).

According to the second embodiment, when the resin part 660 is formed of a material having different CTI, although a disadvantage is caused from the productivity point of view, restriction of the creepage distance can be reduced. Thus, for example, when a part between the high potential power terminal 40 and the low potential power terminal 42 is formed of a material having a relatively high CTI, in comparison with a case in which the material having the relatively low CTI is used to form, the creepage distance between the high potential power terminal 40 and the low potential power terminal 42 can be made smaller and the parasitic inductance can be further reduced.

Although in the embodiment shown in FIG. 14A, FIG. 14B and FIG. 15, the high CTI part 662 is formed between the high potential power terminal 40 and the low potential power terminal 42, the high CTI part 662 may be formed between other first potential part P and the second potential part N.

Next, another embodiment (third embodiment) will be described.

Figure 16:
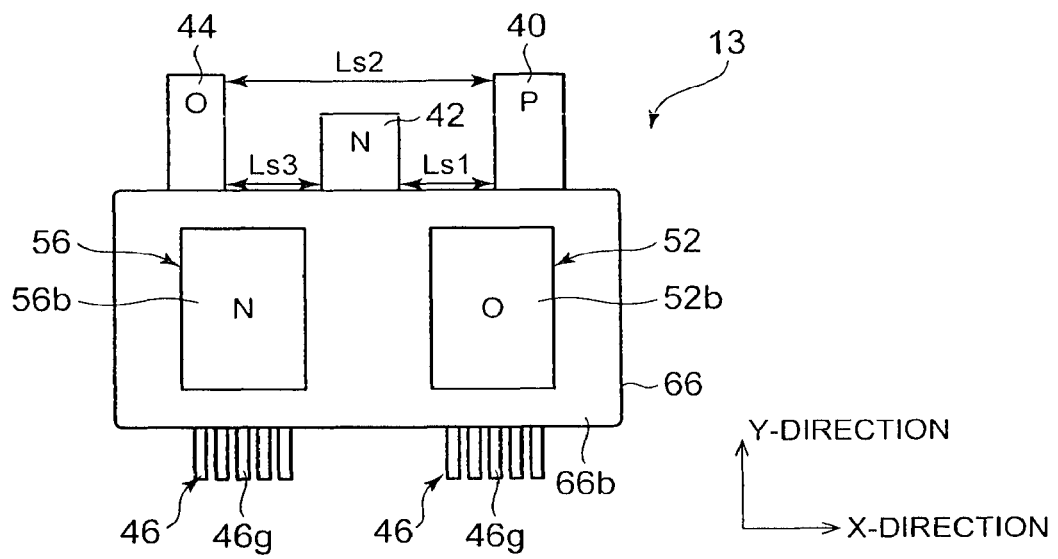
FIG. 16 is a diagram that shows a semiconductor device according to a third embodiment.

FIG. 16 is a diagram that shows a semiconductor device 13 according to the third embodiment. The semiconductor device 13 is different from the semiconductor device 10 according to the above-described first embodiment in a point that a relationship of spatial distances described below is satisfied. Also about the various variant embodiments to the above-described first embodiment, a way of thinking of the spatial distance described below can be applied. In the semiconductor device 13, although the first creepage distance between the first potential part P and the second potential part N may be smaller than the minimum value of the second creepage distance between the first potential part P and the third potential part O, and smaller than the minimum value of the third creepage distance between the second potential part N and the third potential part O, it is preferable to have a relationship of the creepage distance the same as that of the above-described first embodiment.

Specifically, a first spatial distance between the first potential part P and the second potential part N (a minimum value thereof when a plurality thereof is present) is longer than a second spatial distance between the first potential part P and the third potential part O (a minimum value thereof when a plurality thereof is present), or longer than a third spatial distance between the second potential part N and the third potential part O (a minimum value thereof when a plurality thereof is present). However, the second spatial distance and the third spatial distance are set to be the lower limit (for example, the minimum spatial distance based on JIS standard) or more. Thus, likelihood of the short-circuiting between the first potential part P and the second potential part N due to a space discharge can be reduced. That is, even when the space discharge is caused, before the short-circuiting is caused between the first potential part P and the second potential part N, the short-circuiting can be caused between the first potential part P and the third potential part O (for example, between the collector and the emitter of the IGBT element 20) or between the second potential part N and the third potential part O (for example, between the collector and the emitter of the IGBT element 30).

In the embodiment shown in FIG. 16, the high potential power terminal 40, the low potential power terminal 42 and the output terminal 44 are formed such that the first spatial distance Ls1 between the high potential power terminal 40 and the low potential power terminal 42 is longer than the third spatial distance Ls3 between the low potential power terminal 42 and the output terminal 44. Thus, before the short-circuiting is caused between the first potential part P and the second potential part N, the short-circuiting can be caused between the second potential part N and the third potential part O (for example, between the collector and the emitter of the IGBT element 30).

In the embodiment shown in FIG. 16, from a positional relationship between the high potential power terminal 40, the low potential power terminal 42 and the output terminal 44, the second spatial distance Ls2 between the high potential power terminal 40 and the output terminal 44 is sufficiently long, therefore, the second spatial distance Ls2 may not be substantially considered. However, in a configuration shown in, for example, FIG. 9, since the second spatial distance between the terminal 49 and the control terminal 46 (form the third potential part O) can be made smaller, the first spatial distance may be set larger than such second spatial distance.

Figure 17:
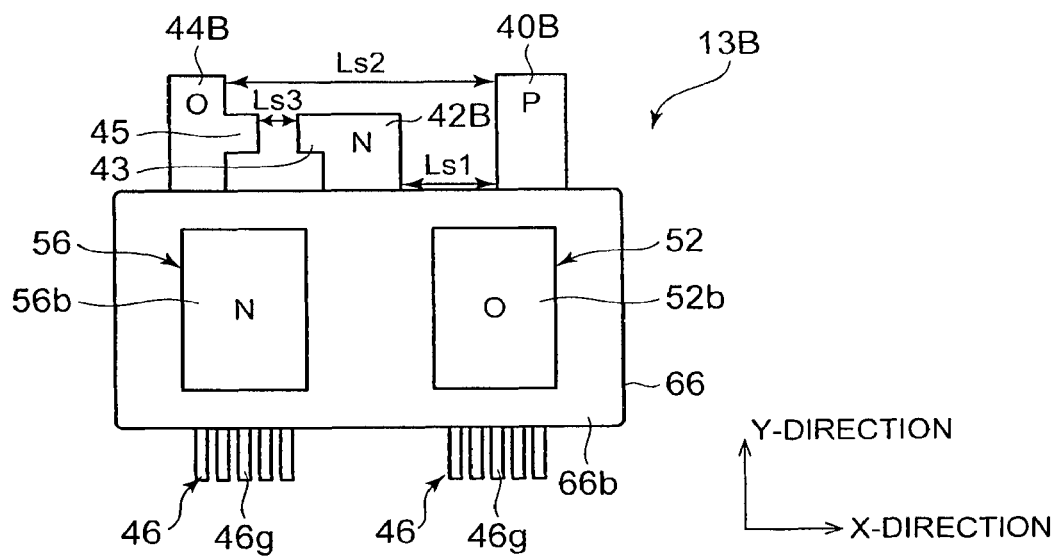
FIG. 17 is a top view that shows a semiconductor device according to another variant embodiment of the third embodiment.

FIG. 17 is a top view that shows a semiconductor device 13B according to another variant embodiment of the third embodiment. The semiconductor device 13B is different from the semiconductor device 13 according to the above-described third embodiment, as shown in FIG. 17, in a point that the low potential power terminal 42 and the output terminal 44 are substituted with a low potential power terminal 42B and an output terminal 44B.

The low potential power terminal 42B includes a protrusion part 43 that protrudes in the X-direction toward the output terminal 44B, and the output terminal 44B includes a protrusion part 45 that protrudes in the X-direction toward the low potential power terminal 42B. Thus, the third spatial distance Ls3 between the low potential power terminal 42B and the output terminal 44B may be positively made smaller. However, the third spatial distance Ls3 is set to be the lower limit (for example, the minimum spatial distance based on JIS standard) or more. Thus, the first spatial distance Ls1 between the high potential power terminal 40 and the low potential power terminal 42B can be readily made longer than the third spatial distance Ls3 between the low potential power terminal 42B and the output terminal 44B.

In the embodiment shown in FIG. 17, any one of the protrusion part 43 and the protrusion part 45 may be omitted. Further, the protrusion part 43 and the protrusion part 45 may be formed over an entirety of the exposed parts of the low potential power terminal 42B and output terminal 44B. That is, by expanding widths (widths in the X-direction) of the exposed parts of the low potential power terminal 42B and the output terminal 44B, the first spatial distance Ls1 between the high potential power terminal 40 and the low potential power terminal 42B may be made to be longer than the third spatial distance Ls3 between the low potential power terminal 42B and the output terminal 44B.

Although the respective embodiments have been described in detail, without limiting to particular embodiment, in a range described in claims, various variations and alterations can be made. Further, also all or a plurality of constituent elements of the above-described embodiments can be combined.

For example, in the embodiments described above, IGBT elements 20 and 30 are used as a switching element. However, a switching element other than the IGBT element such as a MOSFET (Metal Oxide Semiconductor Field-Effect Transistor) may be used. Further, the IGBT elements 20 and 30 may be a reverse conductive IGBT (RC-IGBT) that incorporates the FWD elements 28 and 38.

What is claimed is:
1. A semiconductor device comprising:
a first switching element that includes a first electrode and a second electrode, the first electrode and the second electrode of the first switching element being respectively located on each side of the first switching element in a first direction;
a second switching element that is connected to and aligned with the first switching element in a second direction, which is orthogonal to the first direction, the second switching element including a first electrode and a second electrode, the first electrode and the second electrode of the second switching element being respectively located on each side of the second switching element in the first direction;
a first metal heat sink that is disposed on a lower surface of the first electrode of the first switching element and electrically connected with the first electrode of the first switching element in the first direction;
a second metal heat sink that is disposed on a lower surface of the first electrode of the second switching element and electrically connected with the first electrode of the second switching element in the first direction;
a first terminal that extends from the first metal heat sink, the first terminal having a potential on a high potential side of the first switching element;

a second terminal that has a potential on a low potential side of the second switching element, which is lower than the potential on the high potential side;

a third terminal that is located adjacent to the second terminal and extends from the second metal heat sink, the third terminal having a potential at a midpoint potential between the potential of the first terminal and the potential of the second terminal; and a resin part that integrally covers the first switching element, the second switching element, at least a part of the first metal heat sink, at least a part of the second metal heat sink, a part of the first terminal, a part of the second terminal, and a part of the third terminal, wherein:

portions of any of the first switching element, the second switching element, the first metal heat sink, and the second metal heat sink that are not covered by the resin part include:
- a first potential part that has a potential equal to the potential of the first terminal,
- a second potential part that has a potential equal to the potential of the second terminal, and
- a third potential part that has a potential equal to the potential of the third terminal, a comparative tracking index of a portion of the resin part that is located between the first potential part and the second potential part is higher than a comparative tracking index of a portion of the resin part located between the first potential part a comparative tracking index of a portion of the resin part located between the second potential part and the third potential part, and the portion of the resin part having the relatively higher comparative tracking index extends between and surrounds the first potential part and the second potential part, and relative locations in the semiconductor device of each of the first potential part, the second potential part, and the third potential part satisfy at least one of the following formulas:

$R2 < R1$, and $R3 < R1$, which are defined as:
R1 is a first creepage distance ratio of $(L_1 - L_1 \text{ min})/L_1 \text{ min}$, whereby $L_1$ is a smallest creepage distance between the first potential part and the second potential part in the resin part, which is a value greater than 4 mm and less than 8 mm, and $L_1$ min is a minimum threshold creepage distance between the first potential part and the second potential part, which is set as 4 mm according to a minimum standard creepage distance according to Japanese Industrial Standards (JIS), R2 is a second creepage distance ratio of $(L_2 - L_2 \text{ min})/L_2 \text{ min}$, whereby $L_2$ is a smallest creepage distance between the first potential part and the third potential part in the resin part, which is a value greater than 8 mm, and $L_2$ min is a minimum threshold creepage distance between the first potential part and the third potential part, which is set as 8 mm according to a minimum standard creepage distance according to JIS, and R3 is a third creepage distance ratio of $(L_3 - L_3 \text{ min})/L_3 \text{ min}$, whereby $L_3$ is a smallest creepage distance between the second potential part and the third potential part, which is a value greater than 8 mm, and $L_3$ min is a minimum threshold creepage distance between the second potential part and the third potential part, which is set as 8 mm according to a minimum standard creepage distance according to JIS.

2. The semiconductor device according to claim 1, wherein
the second terminal is located between the first terminal and the third terminal, and
the first terminal, the second terminal and the third terminal extend on one side of the resin part.

3. The semiconductor device according to claim 2, wherein
the first terminal, the second terminal and the third terminal are aligned with each other in the second direction while extending in a third direction orthogonal to both the first direction and the second direction, and
the second terminal extends in the third direction from a position between the first metal heat sink and the second metal heat sink in the second direction.

4. The semiconductor device according to claim 1, wherein
the first metal heat sink includes a first surface exposed from the resin part and a second surface that is an opposite surface of the first surface of the first metal heat sink and faces the first electrode of the first switching element in the first direction,
the first surface of the first metal heat sink forms the first potential part together with the first terminal,
the second metal heat sink includes a first surface exposed from the resin part and a second surface that is an opposite surface of the first surface of the second metal heat sink and faces the first electrode of the second switching element in the first direction, and
the first surface of the second metal heat sink forms the third potential part together with the third terminal.

5. The semiconductor device according to claim 4, further comprising:
a third metal heat sink that is electrically connected with the second electrode of the first switching element, the second electrode of the first switching element being opposite to the first electrode of the first switching element in the first direction; and
a fourth metal heat sink that is electrically connected with the second electrode of the second switching element, the second electrode of the second switching element being opposite to the first electrode of the second switching element in the first direction, wherein
the third metal heat sink includes a first surface exposed from the resin part and a second surface that is an opposite surface of the first surface of the third metal heat sink and faces the second electrode of the first switching element in the first direction,
the first surface of the third metal heat sink forms the third potential part together with the third terminal and a surface of the second metal heat sink,
the fourth metal heat sink includes a first surface exposed from the resin part and a second surface that is an opposite surface of the first surface of the fourth metal heat sink and faces the second electrode of the second switching element in the first direction, and
the first surface of the fourth metal heat sink forms the second potential part together with the second terminal.

* * * * *